United States Patent
Sato et al.

(10) Patent No.: US 7,492,023 B2
(45) Date of Patent: Feb. 17, 2009

(54) SOLID STATE IMAGING DEVICE

(75) Inventors: Tsuneo Sato, Saitama (JP); Atsuhiko Ishihara, Saitama (JP); Akihiro Uchida, Saitama (JP); Koji Kaseda, Saitama (JP); Masahiro Kato, Saitama (JP); Shigeru Kondo, Saitama (JP)

(73) Assignee: FujiFilm Corporation, Tokyo (JP)

( * ) Notice: Subject to any disclaimer, the term of this patent is extended or adjusted under 35 U.S.C. 154(b) by 161 days.

(21) Appl. No.: 11/089,180

(22) Filed: Mar. 25, 2005

(65) Prior Publication Data

US 2005/0212069 A1 Sep. 29, 2005

(30) Foreign Application Priority Data

Mar. 26, 2004 (JP) ............................ 2004-093629
Mar. 30, 2004 (JP) ............................ 2004-100655

(51) Int. Cl.
*H01L 31/232* (2006.01)
(52) U.S. Cl. .................. 257/432; 348/340; 250/214.1
(58) Field of Classification Search .................. 257/98, 257/432, 433, 434, E31.117, E21.001, E31.127; 438/66; 385/14, 147; 250/214.1, 239
See application file for complete search history.

(56) References Cited

U.S. PATENT DOCUMENTS

| 6,483,179 | B2 | 11/2002 | Iizima et al. |
| 6,798,031 | B2* | 9/2004 | Honda et al. ................. 257/433 |
| 2003/0123779 | A1* | 7/2003 | Hashimoto .................... 385/14 |
| 2004/0124511 | A1* | 7/2004 | Li ............................... 257/678 |
| 2004/0136244 | A1* | 7/2004 | Nakamura et al. .......... 365/200 |
| 2004/0189855 | A1* | 9/2004 | Takasaki et al. ............. 348/340 |
| 2005/0012032 | A1* | 1/2005 | Onodera et al. .......... 250/214.1 |
| 2005/0077451 | A1* | 4/2005 | Minamio ................. 250/214.1 |

FOREIGN PATENT DOCUMENTS

| JP | 5-56916 | 3/1993 |
| JP | 5-329100 | 12/1993 |

* cited by examiner

*Primary Examiner*—Steven Loke
*Assistant Examiner*—Tram H Nguyen
(74) *Attorney, Agent, or Firm*—McGinn IP Law Group, PLLC

(57) ABSTRACT

A zener diode is formed in a spacer, which adhered on the semiconductor substrate so as to surround an image sensor, by semiconductor process. A first contact terminal is connected to a CCD output terminal of the image sensor, and a second contact terminal is connected to a ZD ground terminal on the semiconductor substrate. When the ZD ground terminal is connected to ground, the zener diode is actuated. Capacitance components of the zener diode smoothes a waveform of the CCD output so as to prevent an unnecessary radiation noise from generating.

13 Claims, 6 Drawing Sheets

MANUFACTURING LINE FOR SOLID STATE IMAGING DEVICE

INSPECTION LINE FOR SOLID STATE IMAGING DEVICE

SOLID STATE IMAGING DEVICE

BACKGROUND OF THE INVENTION

1. Field of the Invention

The present invention relates to an improvement of a solid state imaging device of a wafer-level chip size package type.

2. Description Related to the Prior Art

A digital camera and a digital video camera with use of a solid state imaging device such as a CCD, a CMOS, and the like is in widespread use. A conventional solid state imaging device has a structure where an image sensor chip which is a semiconductor substrate is contained in a package and is sealed by a transparent glass rid. Because of increasing demand for a mobile phone or the like with the image-taking function, the solid state imaging device is required to be smaller.

As a packaging method to make the solid state imaging device smaller, a wafer-level chip size packaging (hereinafter WLCSP) is disclosed in U.S. Pat. No. 6,483,179. In the WLCSP, a semiconductor device package is obtained by dicing the wafer after packaging is completed in a semiconductor wafer process. A solid state imaging device manufactured by the WLCSP can largely reduce its size in comparison with the conventional solid state imaging device manufactured by the ceramic packaging.

It is known that unnecessary radiation noise (EMI) emitted from the solid state imaging device adversely affect adjacent electronic devices. For example, in the CCD, the unnecessary radiation noise is caused by a horizontal transfer pulse and a reset signal both running at high clock rate, and a CCD-RAW signal synchronizing with the horizontal transfer pulse. To prevent the generation of the unnecessary radiation noise, the solid state imaging devices are covered with shields, in Japanese Patent Laid-Open Publications No.05-329100 and No.05-056916.

In addition, conventionally, a zener diode is connected to a CCD output terminal of the solid state imaging device such that capacitance components of the zener diode smoothes the output waveform, to prevent the generation of the unnecessary radiation noise.

However, because the solid state imaging device of the WLCSP type is very small, it is difficult to cover the solid state imaging device without blocking the use area of the image sensor. Further, the merit of being small is spoiled if the solid state imaging device of the WLCSP type is covered with the shield. In addition, the zener diode is required to position as near to the solid state imaging device as possible, because the effect of preventing the unnecessary radiation noise becomes better when the zener diode connects to the solid state imaging device at the position closer to the solid state imaging device.

SUMMARY OF THE INVENTION

An object of the present invention is to prevent emission of unnecessary radiation noise with preventing the growth in size of a solid state imaging device of WLCSP type.

In order to achieve the above object and the other objects, a solid state imaging device of the present invention includes a spacer in which a zener diode is embedded and connected to an image sensor. The spacer is formed of silicon, and the zener diode is formed by semiconductor process. In addition, a ground terminal of the zener diode is extended to outside of the spacer, and the surfaces of the terminals of the zener diode are roughened.

According to the present invention, since the zener diode is provided in the spacer, a distance between the zener diode and the image sensor can become short. Therefore, generation of the unnecessary radiation noise is prevented effectively. Since the zener diode is formed in the spacer made of silicon during the semiconductor process, there is no need to mechanically embed the zener diode in the narrow spacer, and the size of the solid state imaging device is not enlarged. Since the ground terminal of the zener diode is extended to the outside of the spacer, if there is no problem of unnecessary radiation noise as result of inspection of the solid state imaging device, it can be selected not to use the zener diode by keeping the ground terminal in the open state. Since the surfaces of the terminals of the zener diode are roughened, the contact area to the terminals of the image sensor can be increased.

In addition, by providing a semiconductor device for wireless communication to a solid state imaging device of the present invention, data related to the solid state imaging device can be read out by wireless communication, the non-contact communication means. Accordingly, even if the solid state imaging device of the WLCSP type which has very small size is used, the data can be read out easily with low-cost technology. And since an antenna for wireless communication is provided on the spacer, the size of the solid state imaging device is not enlarged for making the space for the antenna. Further, because the length of the antenna can be lengthened, it can increase transmission distance of the semiconductor device for wireless communication such that the data of the solid state imaging device can be read out from the outside of an electronic apparatus in which the solid state imaging device is embedded. In addition, by attaching the semiconductor device for wireless communication near a first terminal of the solid state imaging device, the semiconductor device for wireless communication can be used as the mark for distinguishing the first terminal.

BRIEF DESCRIPTION OF THE DRAWINGS

The above objects and advantages of the present invention will become easily understood by one of ordinary skill in the art when the following detailed description would be read in connection with the accompanying drawings.

PREFERRED EMBODIMENTS OF THE INVENTION

Figure 1:
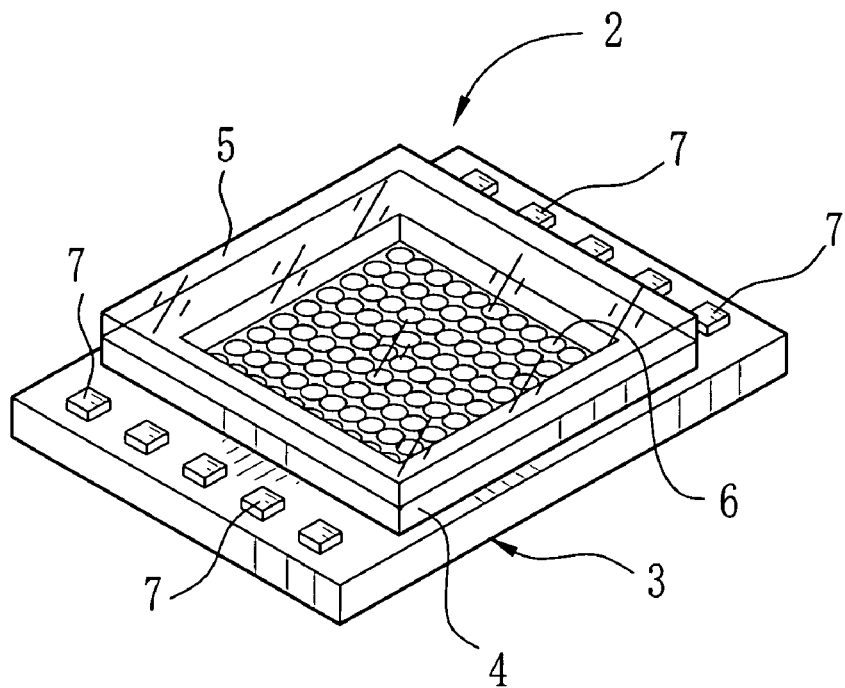
FIG. 1 is a perspective view of a solid state imaging device of the present invention.
Figure 2:
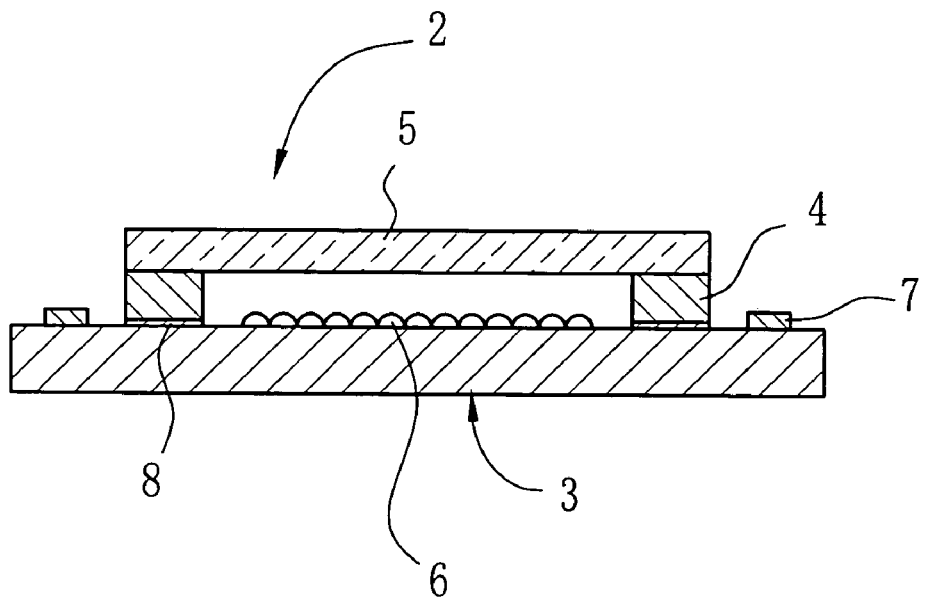
FIG. 2 is a partially sectional view of the solid state imaging device.

As shown in FIG. 1 and FIG. 2, a solid state imaging device 2 of WLCSP type is constructed of a semiconductor substrate 3, a frame-like spacer 4 which is adhered on the semiconductor substrate 3 with an adhesive agent 8, and a cover glass 5 which is adhered above the spacer 4 so as to seal the inside of the spacer 4.

On the semiconductor substrate 3, an image sensor 6 (photoelectric conversion area) and a plurality of contact terminals 7 which electrically connect to the image sensor 6 are provided. The image sensor 6 is, for example, a CCD (charge coupled device) image sensor including plural pixels arranged in matrix form. A micro lens and color filters are superimposed on each pixel, as known. The contact terminals 7 are formed such that conductive materials are printed on the semiconductor substrate 3, for example. In a similar way, each contact terminal 7 is connected to the image sensor 6 by printed wiring.

The spacer 4 is formed of an inorganic material such as silicon, and surrounds the image sensor 6. A transparent α-ray shielding glass is used as the cover glass 5, so as to prevent that photodiodes of the CCD are destroyed by the α-ray. Since a space between the image sensor 6 and the cover glass 5 is provided, condensing performance of the micro lens do not become worse.

The solid state imaging device 2 is incorporated in a small electronic apparatus (such as a digital camera, a mobile phone and the like), together with a taking lens for focusing subject images on the image sensor 6, a memory for storing the image data generated according to the image pick up, a control circuit for controlling the solid state imaging device 2, and so on. Since the solid state imaging device 2 of WLCSP type has the size and the thickness nearly equal to these of the bare chip, the apparatus incorporating the solid state imaging device 2 can be downsized.

The solid state imaging device 2 is produced in such a way as described next. First, the silicon is superimposed on a transparent glass substrate as the base material of the cover glass 5, and then the plural spacers 4 are formed on the glass substrate by photolithography, development, etching and so on. Next, with the adhesive agent applied on end faces of the spacers 4, the spacers 4 are adhered on a wafer on which a plurality of the image sensors 6 and the contact terminals 7 are formed, such that the each image sensor 6 are closed inside the spacer 4 and the glass substrate. Finally, the glass substrate together with the wafer is diced into individual solid state imaging devices 2.

Figure 3:
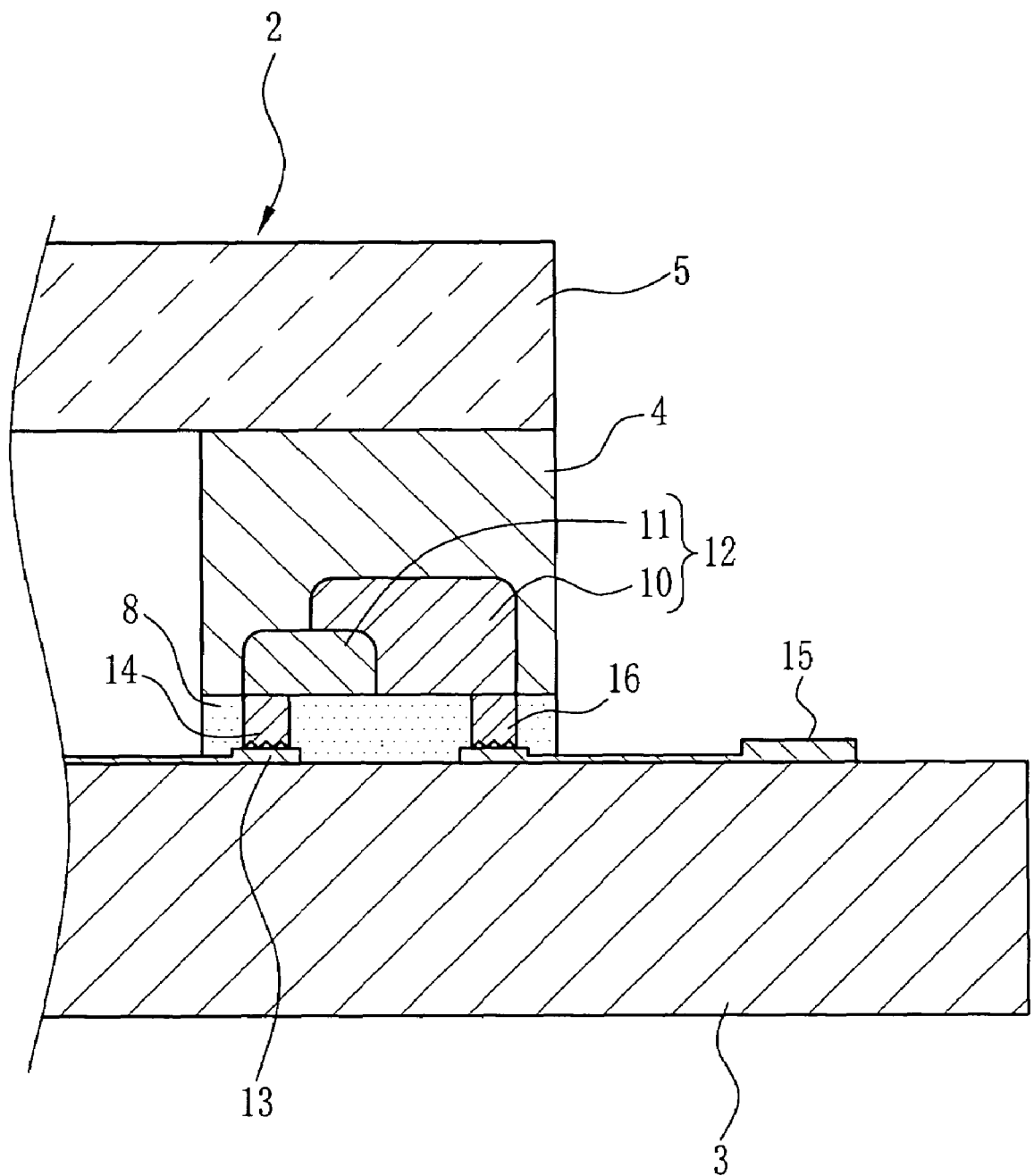
FIG. 3 is a partially sectional view of a zener diode in a spacer.

As shown in FIG. 3, in the spacer 4, a zener diode 12 consisting of a p-type region 10 and an n-type region 11 is formed by semiconductor process. On the bottom surface of the zener diode 12, a first contact terminal 14 which electrically connects to a CCD output terminal 13 of the image sensor 6, and a second contact terminal 16 which electrically connects to a ground terminal 15 for the zener diode (hereinafter ZD ground terminal) formed on the semiconductor substrate 3, are formed. The surfaces of the terminals 14, 16 are roughened for increasing contact area. Therefore, the terminals 14, 16 can more tightly connect to the terminals 13, 15 of the semiconductor substrate 3.

The ZD ground terminal 15 is extended to the outside of the spacer 4, and is in the open state not to connect a ground terminal of the solid state imaging device 2. According to this construction, if there is no problem of unnecessary radiation noise as a result of inspection on the solid state imaging device 2 after manufacturing, it can be selected not to use the zener diode 12 by keeping the ZD ground terminal 15 in the open state. Note that the zener diode 12 can be formed in the spacer 4 by the semiconductor process, after superimposing the silicon on the glass substrate or forming the spacer 4 by the etching, as stated above.

Because the zener diode 12 is formed in the spacer 4, capacitance components of the zener diode 12 smoothes the waveform of CCD output of the solid state imaging device 2. Therefore, generating the unnecessary radiation noise is prevented. In addition, because the zener diode 12 is positioned very close to the image sensor 6, the generation of the unnecessary radiation noise is prevented more effectively. The solid state imaging device 2 need not be enlarged, the merit of the solid state imaging device 2 of the WLCSP type is maintained. In the case that there is no need for the measures against the unnecessary radiation noise, it can be selected not to use the zener diode 12 by keeping the ZD ground terminal 15 in the open state.

In the above embodiment, the ground terminal of the zener diode is in the open state. However, this terminal may be connected to the ground terminal of the solid state imaging device, or may be directly connected to the ground terminal of a circuit board on which the solid state imaging device is attached. In addition, any other semiconductor device, such as a transistor, may be formed in the spacer.

By the way, the solid state imaging device is usually provided with a manufacturing number including a lot number and a serial number. In addition, after manufacturing, the solid state imaging device is sent to an inspection line for a performance inspection and flaw detection to identify any defect pixel in the solid state imaging device. In the digital camera including this solid state imaging device, parameters for image correction will be adjusted based on a flaw data representing the result of the flaw detection.

However, the solid state imaging device of the WLCSP type is extremely small with the sides of few millimeters in length, therefore there is no space for printing the manufacturing number. In addition, in the case that the manufacturing number and the flaw data are recorded in an unused area of the image sensor of the solid state imaging device of the WLCSP type, a device for reading out the data, by connecting a probe or the like to the contact terminal of the solid state imaging device, is needed. Therefore, this method is not practical in view of workability and cost.

In the semiconductor device such as the solid state imaging device, one of the plural terminals is determined as a first terminal to act as a reference for attaching orientation. In order to emphasize the first terminal, a mark is printed on, or a notch is formed in the semiconductor device. However, it is difficult to distinguish the first terminal in the solid state imaging device of the WLCSP type, which is very small.

In FIG. 4 to FIG. 11, an embodiment in which the manufacturing number, the flaw data and the like are easily read out from the solid state imaging device of the WLCSP type, and the first terminal is easily distinguished, is shown.

Figure 4:
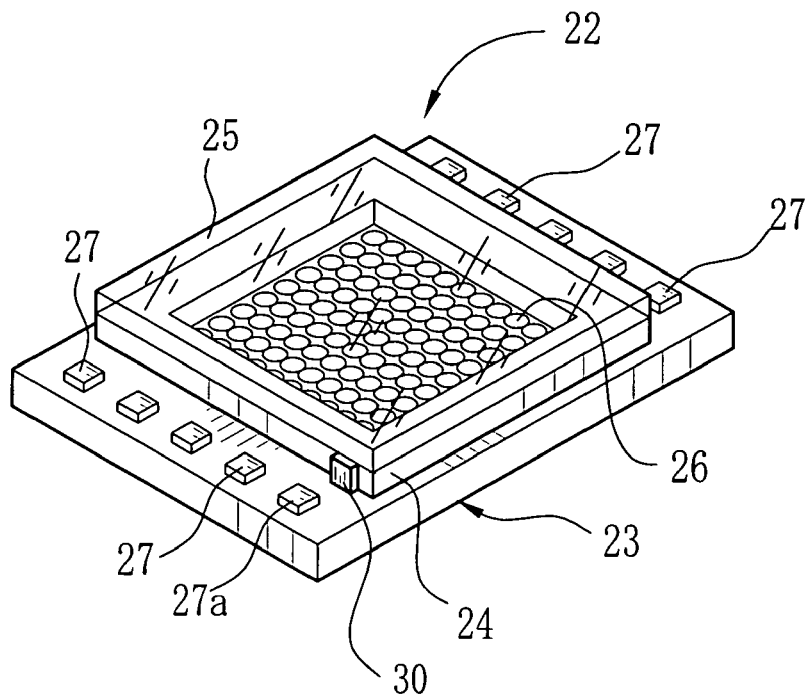
FIG. 4 is a perspective view of a solid state imaging device of another embodiment.

As shown in FIG. 4, on a side surface of a spacer 24, near a first terminal 27a, a semiconductor device for wireless communication, so-called a wireless IC tag 30 is adhered with the adhesive agent or the like. The wireless IC tag 30 is a non-contact IC memory, which can communicate through electromagnetic wave, and become widely used as a component of an RFID (Radio Frequency Identification) system, as well known. There is the wireless IC tag 30 which has the sides of a few tenth of a millimeter in length so small to be able to be attached to the small solid state imaging device 22 of the WLCSP type.

By attaching the wireless IC tag 30 near the first terminal 27a, the wireless IC tag 30 can also be used as the mark for indicating the first terminal 27a. The wireless IC tag 27a projects from the side surface of the spacer 24 to be able to be visible when the solid state imaging device 22 is seen from above. Therefore, failure in attaching the solid state imaging device 22 on a mounting board does not happen.

Figure 5:
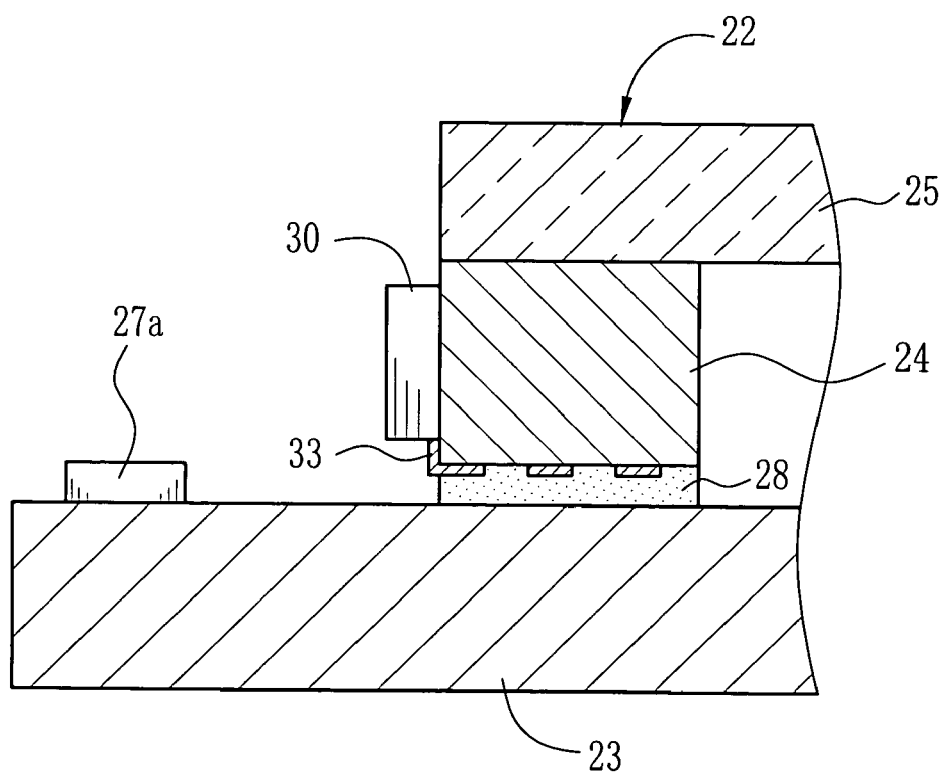
FIG. 5 is a partially sectional view of a spacer and its vicinity.
Figure 6:
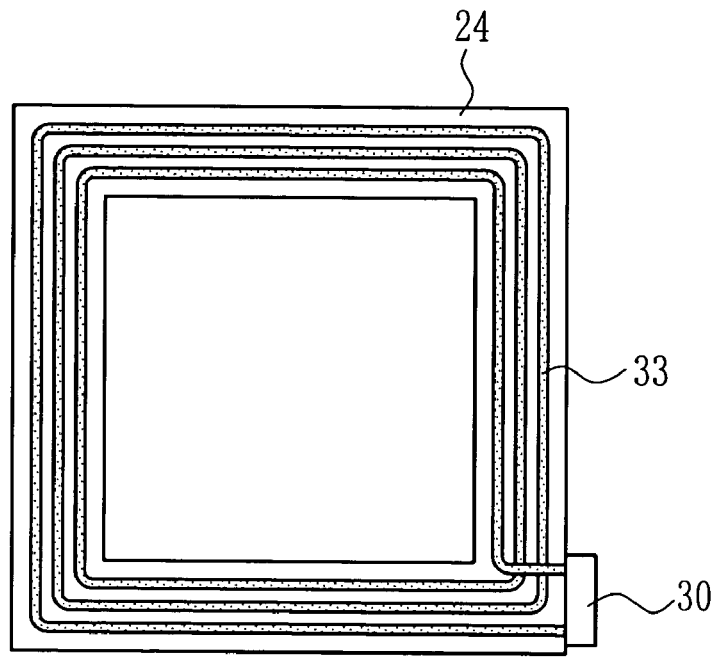
FIG. 6 is a plan view of the spacer.

As shown in FIG. 5 and FIG. 6, an antenna 33 of the wireless IC tag 30 is provided between the spacer 24 and the semiconductor substrate 23, and has a loop shape which surrounds an image sensor 26. The antenna 33 is formed for example such that an conductive material is printed on an edge surface of the spacer 24, after the spacer 24 is formed on a glass substrate as a base material of a cover glass 25. The wireless IC tag 30 may be attached to the spacer 24 when forming the antenna 33 or after manufacturing the solid state imaging device 22. The wireless IC tag 30 connects to the end of the antenna 33 which is extended to the side surface of the spacer 24.

Figure 7:
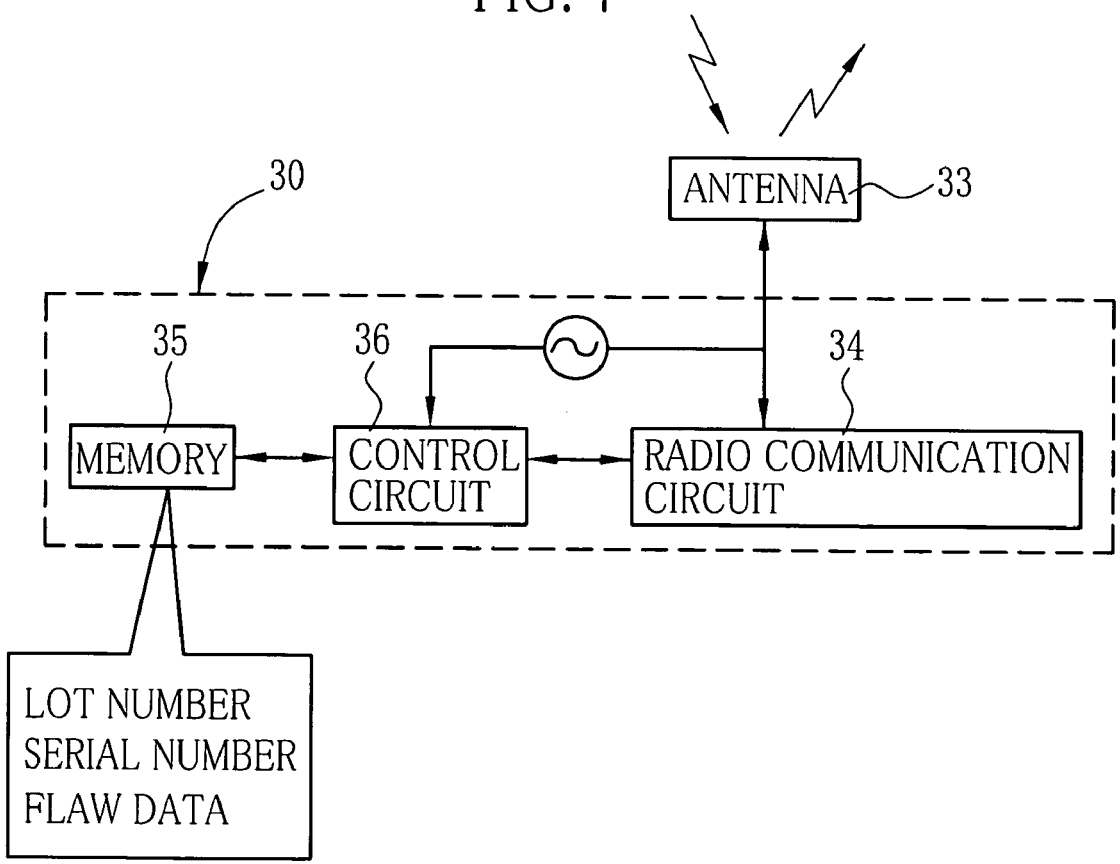
FIG. 7 is a block diagram illustrating a construction of a wireless IC tag.
Figure 8:
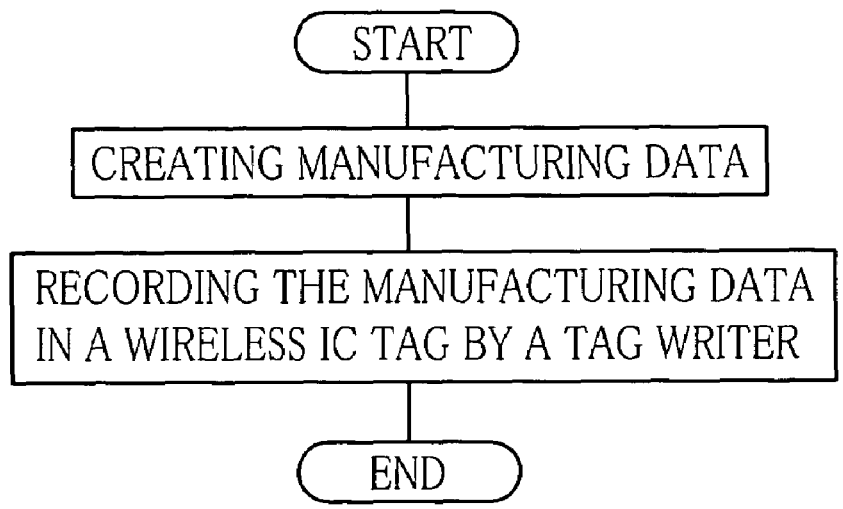
FIG. 8 is a flowchart illustrating recording processes for manufacturing data in a manufacturing line for the solid state imaging device.
Figure 9:
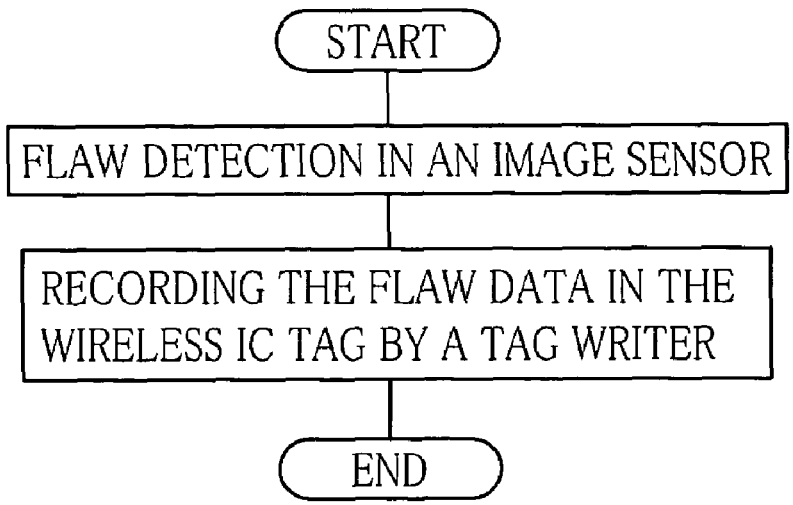
FIG. 9 is a flowchart illustrating recording processes for flaw data in an inspection line for the solid state imaging device.

As shown in FIG. 7, the wireless IC tag 30 has a radio communication circuit 34 for communicating data on radio through the antenna 33, a memory 35 for storing data, and a control circuit 36 for controlling these components. Because the wireless IC tag 30 is powered by electromagnetic induction with the radio wave received at the antenna 33, there is no need to provide a battery or the like.

As the memory 35 of the wireless IC tag 30, a nonvolatile memory such as an EEPROM which can maintain the stored data without supply of the electric power is used. As shown in flowcharts of FIG. 8 and FIG. 9, in the memory 35 of the wireless IC tag 30, for example a manufacturing data including a lot number and a serial number which are given when the solid state imaging device 22 is manufactured, and a inspection data including a flaw data which is obtained on inspection of the solid state imaging device 22, are written by wireless IC tag writers disposed in a manufacturing line and a inspection line.

Figure 10:
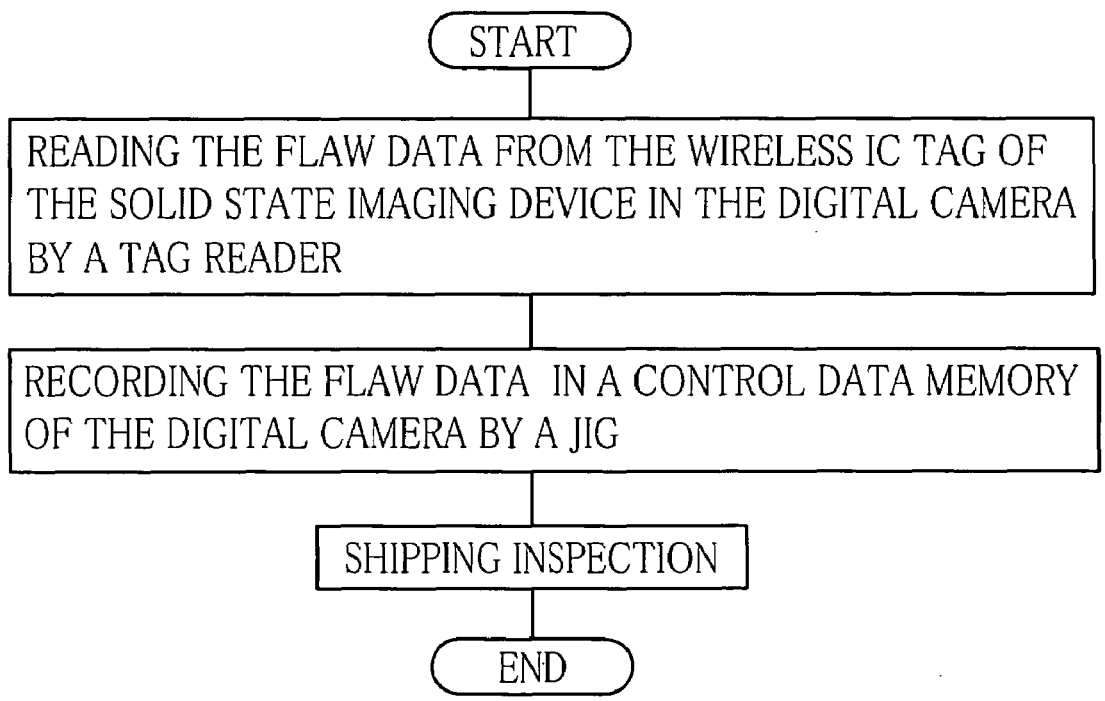
FIG. 10 is a flowchart illustrating reading out and recording processes for the flaw data in an inspection line for a digital camera.
Figure 11:
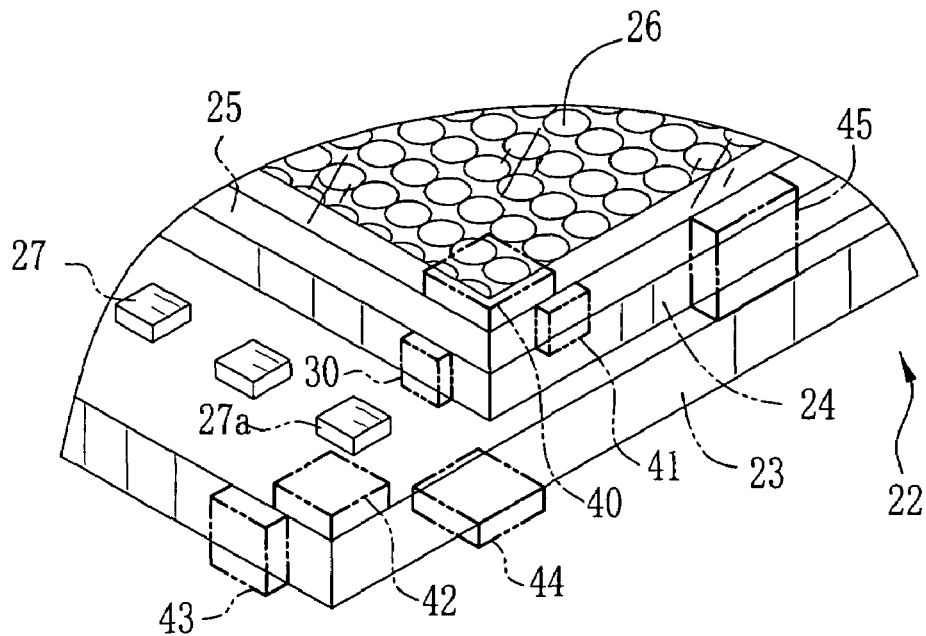
FIG. 11 is an explanatory view illustrating possible positions for the wireless IC tag on the solid state imaging device.

As shown in a flowchart of FIG. 10, the flaw data recorded in the memory 35 of the wireless IC tag 30 is read out by the wireless IC tag reader from outside of the digital camera for example before shipping inspection of the digital camera including the solid state imaging device 22. Then a data recording device or the like writes the flaw data in a control data memory of the digital camera. Therefore, the flaw data of the solid state imaging device 22 can be used as one of the parameters for image correction in the digital camera. In addition, when a trouble thought to be from the solid state imaging device 22 is caused in the digital camera, the solid state imaging devices in the same lot and soon are easily checked for detect occurrence of some such by reading out the manufacturing data of the solid state imaging device 22 with the wireless IC tag reader from outside of the digital camera.

Note that in the above embodiment, the wireless IC tag 30 is attached on the side surface of the spacer 24. However, as shown by numerals 40-44 in FIG. 11, the wireless IC tag 30 may be attached on the top surface or the side surfaces of the cover glass 25, or the top surface, the side surfaces or the bottom surface of the semiconductor substrate 3. In addition, as shown by numeral 45, the wireless IC tag having large size may be positioned so as to contact the semiconductor substrate 23, the spacer 24, and the cover glass 25.

In the above embodiment, the antenna is provided between the semiconductor substrate and the spacer. However, the antenna may be provided between the spacer and the cover glass, or on the top surface of the cover glass. In addition, date of manufacture, manufacturer information, shipping inspection data, maintenance service data, contact information of the manufacturer, sensitivity data, model number, OK/NG data and the like may be also recorded in the wireless IC tag. In the above embodiment, the wireless IC tag is electromagnetic type. However, a wireless IC tag of microwave type may also be used.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid state imaging device, comprising:
   a substrate on which an image sensor having plural pixels is formed;
   a frame-like spacer adhered on said substrate so as to surround said image sensor;
   a cover glass adhered above said spacer so as to seal inside of said spacer; and
   a semiconductor device embedded in said spacer, connected to an output of said image sensor, and disposed between said substrate and said cover glass,
   wherein said semiconductor device is disposed directly under said cover glass.

2. A solid state imaging device as described in claim 1, further comprising a first terminal formed on an undersurface of said semiconductor device, and said first terminal electrically contacting a second terminal which is connected to said image sensor.

3. A solid state imaging device as described in claim 2, wherein said spacer comprises silicon, and said semiconductor device is formed by a semiconductor process.

4. A solid state imaging device as described in claim 3, wherein said semiconductor device comprises a zener diode.

5. A solid state imaging device as described in claim 4, further comprising a third terminal formed on said undersurface of said semiconductor device, said third terminal electrically contacting a ground terminal formed on said semiconductor substrate, and said ground terminal being connected to a print wiring extending outside said spacer.

6. A solid state imaging device as described in claim 5, wherein said first terminal has a rough surface.

7. A solid state imaging device as described in claim 6, wherein said third terminal has a rough surface.

8. A solid state imaging device as described in claim 1, wherein the substrate comprises a semiconductor substrate, further comprising a ground terminal disposed outside of the spacer on a surface of the semiconductor substrate, the ground terminal being electrically connected to the semiconductor device.

9. A solid state imaging device as described in claim 1, wherein the semiconductor device is disposed adjacent to the image sensor.

10. A solid state imaging device as described in claim 1, wherein the semiconductor device comprises a zener diode.

11. A solid state imaging device comprising:
    a semiconductor substrate on which an image sensor having plural pixels is formed;

a frame-like spacer adhered on said semiconductor substrate so as to surround said image sensor;
a cover glass adhered above said spacer so as to seal inside of said spacer; and
means, formed in said spacer, connected to said image sensor, and disposed between said substrate and said cover glass, for reducing noise,
wherein said means for reducing noise is disposed directly under said cover glass.

12. A solid state imaging device as described in claim 11, wherein the means for reducing noise reduces radiation noise generated in the solid state imaging device.

13. A solid state imaging device as described in claim 11, wherein the means for reducing noise smoothes a waveform image sensor output of the solid state imaging device.

* * * * *